(12) United States Patent
Penouty

(10) Patent No.: US 12,413,084 B2
(45) Date of Patent: Sep. 9, 2025

(54) ASYMMETRIC DEVICE FOR DIAGNOSIS, FOR CHARGING AND/OR FOR DISCHARGING OF ELECTRIC BATTERIES AND CONDUCTORS FOR SAID DEVICE

(71) Applicant: E-XTEQ EUROPE, Saint-Germain-de-la-Grange (FR)

(72) Inventor: Jean-Yves Penouty, Saint-Germain-de-la-Grange (FR)

(73) Assignee: E-XTEQ EUROPE, Saint-Germain-de-la-Grange (FR)

( * ) Notice: Subject to any disclaimer, the term of this patent is extended or adjusted under 35 U.S.C. 154(b) by 327 days.

(21) Appl. No.: 17/773,292

(22) PCT Filed: Oct. 20, 2020

(86) PCT No.: PCT/EP2020/079528
§ 371 (c)(1),
(2) Date: Apr. 29, 2022

(87) PCT Pub. No.: WO2021/083743
PCT Pub. Date: May 6, 2021

(65) Prior Publication Data
US 2024/0154438 A1   May 9, 2024

(30) Foreign Application Priority Data
Oct. 30, 2019   (FR) ........................ 1912195

(51) Int. Cl.
*G01R 31/389* (2019.01)
*G01R 31/382* (2019.01)
(Continued)

(52) U.S. Cl.
CPC .......... *H02J 7/0047* (2013.01); *G01R 31/382* (2019.01); *G01R 31/389* (2019.01);
(Continued)

(58) Field of Classification Search
CPC ...... H02J 7/0047; H02J 7/0029; H02J 7/0042; G01R 31/389; G01R 31/382; G01R 31/58
(Continued)

(56) References Cited

U.S. PATENT DOCUMENTS 6,236,215 B1 * 5/2001 Kanehira ............. G01R 31/396
324/429
2003/0016001 A1   1/2003 Borup
(Continued)

FOREIGN PATENT DOCUMENTS

DE     102012217973 A1   4/2014
EP        3258281 A1   12/2017
(Continued)

OTHER PUBLICATIONS

Burns Engineering, "Errors Related to Cable Resistance Imbalance in Three Wire RTDs", Retrieved from the internet http://burnsengineering.com/local/uploads/files/3_Wire_RTD_Accuracy_Assessment.pdf [retrieved on Jul. 6, 2017], Dec. 31, 2011.
(Continued)

*Primary Examiner* — Nathaniel R Pelton
(74) *Attorney, Agent, or Firm* — Dierker & Kavanaugh, P.C.

(57) ABSTRACT

The present invention is an apparatus (101) for diagnosing, charging and/or discharging electric batteries, said apparatus (101) comprising:
a circuit (103) for diagnosing, charging and/or discharging batteries;
an electrical connection (105) intended to connect said apparatus to the terminals of a battery;
characterised in that said connection (105) includes three electrical conductors, two power conductors (107*a*, 107*b*) intended to be connected respectively to the positive and negative terminals of a battery and a
(Continued)

measuring electrical conductor (109) intended to be connected to one of the terminals of said battery, and in that said apparatus comprises a voltage drop compensation electronic entity (113) allowing compensating for the voltage drop caused by the said power electrical conductors (107a, 107b).

11 Claims, 4 Drawing Sheets

(51) Int. Cl.

| | |
|---|---|
| *G01R 31/58* | (2020.01) |
| *H01M 10/42* | (2006.01) |
| *H01M 10/46* | (2006.01) |
| *H01M 50/569* | (2021.01) |
| *H02J 7/00* | (2006.01) |
| *B60R 16/033* | (2006.01) |
| *G07C 5/08* | (2006.01) |

(52) U.S. Cl.
CPC ........ *G01R 31/58* (2020.01); *H01M 10/4285* (2013.01); *H01M 10/46* (2013.01); *H01M 50/569* (2021.01); *H02J 7/0029* (2013.01); *H02J 7/0042* (2013.01); *B60R 16/033* (2013.01); *G07C 5/0808* (2013.01); *H01M 2220/20* (2013.01)

(58) Field of Classification Search
USPC ......................................................... 320/134
See application file for complete search history.

(56) References Cited

U.S. PATENT DOCUMENTS

| | | | |
|---|---|---|---|
| 2009/0051365 A1* | 2/2009 | Bertness ............... | G01R 31/007 324/503 |
| 2011/0260678 A1* | 10/2011 | Forsythe ............. | H02J 7/00041 320/162 |
| 2014/0107976 A1 | 4/2014 | Kallfelz et al. | |
| 2014/0300347 A1 | 10/2014 | Schramme et al. | |
| 2015/0207343 A1* | 7/2015 | Zhai ...................... | H02J 7/0032 320/112 |
| 2017/0331162 A1 | 11/2017 | Clarke et al. | |

FOREIGN PATENT DOCUMENTS

| | | |
|---|---|---|
| JP | H07094224 A | 4/1995 |
| RU | 181344 U1 | 7/2018 |

OTHER PUBLICATIONS

Vencon Technologies Inc., "Battery Resistance Wire Compensation", https://www.vencon.com/wp-content/uploads/BatWireCompensation.pdf, Dec. 2013.

* cited by examiner

ASYMMETRIC DEVICE FOR DIAGNOSIS, FOR CHARGING AND/OR FOR DISCHARGING OF ELECTRIC BATTERIES AND CONDUCTORS FOR SAID DEVICE

The present invention relates to the field of apparatuses for diagnosing, charging and/or discharging electric batteries, more particularly in the automotive field, as well as to cables allowing connecting said apparatuses to an electric battery.

For example, in the automotive field, cars are equipped with batteries, generally lead for heat-engine vehicles and Li-Ion, Cadmium-Nickel, etc. batteries for electric or hybrid vehicles. These batteries need to be maintained and checked. For this purpose, there are apparatuses, generally distinct one, allowing charging them, discharging them or assessing their state of charge, as well as their state of health.

Thus, it is known to connect diagnosis, charging and/or discharging devices to an electric battery via a Kelvin connection, also referred to as "four-wire connection".

A Kelvin connection is a means allowing establishing electrical contact with a component while eliminating or considerably reducing the effect of parasitic resistances related to this connection, such as contact resistance and/or the resistance of the conductors. This is particularly critical in the context of electric batteries, because certain physical quantities, such as voltage, resistance or internal conductance (reflecting in particular the state of health of the battery), should be measured as accurately as possible, in order to best diagnose, charge and/or discharge the battery.

For example, it could be noted that the internal resistance of the battery generally has a value in the same range of magnitude as the parasitic resistances, usually in the range of a few milliohms, it is therefore important to be able to overcome phenomena impacting this measure.

For this purpose, and as illustrated in FIG. 1, it is known to have a charge and/or discharge diagnosis apparatus 1 provided with a Kelvin connection 3 connecting said apparatus 1 to a battery 5 with an electromotive force EMF and an internal resistance $R_B$. Said Kelvin connection 3 comprises four electrical conductors 7a, 7b, 9a, 9b generally terminating in clamps, 11a and 11b, which clamps are intended to be fastened on the pads of a battery. More particularly, the Kelvin connection 3 comprises two power conductors 7a, 7b and two measuring conductors 9a, 9b.

The power conductors 7a, 7b enable the passage of a high intensity (whether during a diagnosis, or during a charge/discharge of the battery), generally in the range of several amperes, whereas the measuring conductors 9a, 9b enable the measurement of a voltage the closest to the element whose value is to be determined, herein the internal resistance $R_B$ or to its voltage $V_B$ of the battery 5. Thus, this limits the consideration of parasitic resistances, which resistances might in particular distort the measurement of its internal resistance $R_B$, all the more so as the intensity of the current flowing in the power conductors is high.

Thus, the present invention is an alternative embodiment to the Kelvin connection as described hereinabove, allowing making a so-called asymmetrical apparatus for diagnosing, charging and/or discharging electric batteries whose electrical connection connecting said apparatus to the battery comprises only three conductors, two power conductors and a single measuring conductor.

Thus, the invention is a novel apparatus for diagnosing, charging and/or discharging electric batteries, said apparatus comprising:

a circuit for diagnosing, charging and/or discharging batteries;

an electrical connection intended to connect said apparatus to the terminals of a battery;

characterised in that said connection includes three electrical conductors, two power conductors intended to be connected respectively to the positive and negative terminals of a battery and a measuring electrical conductor intended to be connected to one of the terminals of said battery, and in that said apparatus comprises a voltage drop compensation electronic entity allowing compensating for the voltage drop caused by the said power electrical conductors.

Thus, the apparatus according to the invention allows measuring electrical quantities representative of an electric battery without using a Kelvin connection.

This also allows having simpler electrical connectors, reducing the time and cost of manufacturing said conductors and offering an alternative to the use of a so-called "four-wire" connection while preserving an appropriate measurement quality of one or several electrical quantit(y/ies) related to a battery.

It should be noted that by battery is meant any apparatus allowing storing electrical energy, such as an electrochemical battery, a supercapacitor, etc. Moreover, the apparatus according to the invention could also be advantageously applied to the analysis of a device for producing electrical energy, such as a fuel cell.

According to a possible feature, the electronic entity applies a gain G to a measurement voltage $V_m$, the voltage $V_m$ being the voltage at the terminals of one of the power conductors. It should be noted that the measurement voltage $V_m$ has a non-zero value only when a current flows at the power conductors, for example during charging, discharging, or battery diagnosis; said voltage $V_m$ being measured via the measuring conductor.

According to another possible feature, the electronic entity includes at least one electronic component applying an analog gain $G_a$ and/or a digital gain $G_n$ to the measurement voltage $V_m$.

According to another possible feature, said digital gain $G_n$ is generated by software by means of a microprocessor of said apparatus.

According to another possible feature, the gain G is a function of the resistances $R_1$ and $R_2$ associated to said power electrical conductors.

According to another possible feature, said at least one electronic component includes an operational amplifier mounted as a non-inverting amplifier and at least two resistors $R_3$ and $R_4$.

According to another possible feature, the values of the resistances $R_3$ and $R_4$ associated to the operational amplifier are adjustable.

According to another possible feature, the gain $G_a$ is a function of the resistances $R_1$ and $R_2$ associated to the power conductors and of the resistances $R_3$ and $R_4$ associated to the operational amplifier.

According to another possible feature, the measuring conductor is connected to the negative terminal of the battery.

It is advantageous to connect the measuring conductor to the negative terminal of the battery, because said terminal is generally associated to the internal reference of diagnostic, charging and/or discharging apparatuses, thus allowing using the electric power supplies of said apparatuses without having to isolate them galvanically or having one or several dedicated power suppl(y/ies).

According to another possible feature, the voltage compensation electronic entity is disposed in the apparatus.

According to another possible feature, the gain G is adjusted so that when short-circuiting said electrical connection, the voltage measured at the output of the compensation circuit is substantially equal to zero.

It should be noted that this adjustment is performed during the passage of a nominal current adapted to the power conductors, for example in the range of a few tens of amperes for an automotive application, that being so in order to have a non-zero voltage that could be easily measured and modified, until cancellation thereof.

The invention will be better understood, and other aims, details, features and advantages thereof will appear more clearly from the following description of particular embodiments of the invention, provided only for illustration and without limitation, with reference to the appended drawings, wherein:

FIG. 2 is a very schematic representation of an apparatus 101 for diagnosing, charging and/or discharging electric batteries according to the invention. More particularly, the apparatus 101 comprises:

Figure 1:
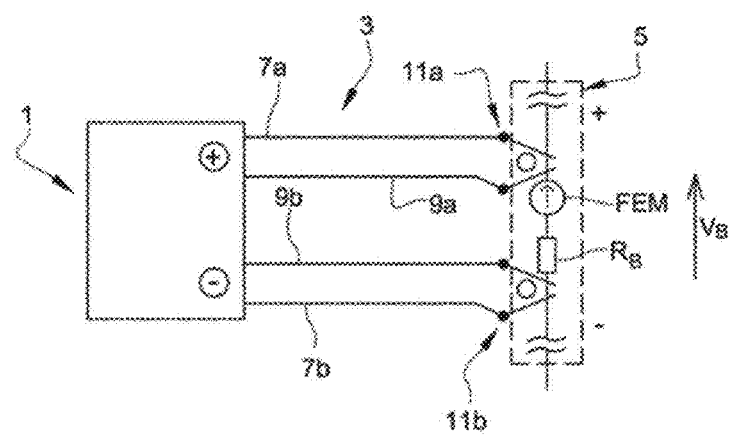
FIG. 1 is a very schematic representation of the prior art.

- a circuit 103 for diagnosing, charging and/or discharging batteries;
- an electrical connection 105 which is intended to connect said apparatus 101 to the terminals of a battery 106 and which includes three electrical conductors, two power conductors 107a and 107b intended to be connected respectively to the positive and negative terminals of a battery 106 and a measuring electrical conductor 109 intended to be connected to one of the terminals of said battery 106.

For example, said connection 105 terminates in clamps 111a and 111b (or any electrical connection means) on which said conductors 107a-b and 109 are fastened, said clamps 111a-b facilitating quick connection between said apparatus 101 and the batteries to be diagnosed, charged and/or discharged. It should also be noted that the measuring conductor 109 is preferably intended to be connected to the negative terminal of the battery 106.

Moreover, said apparatus 101 comprises a voltage drop compensation electronic entity 113 allowing compensating for the voltage loss or drop caused by said power electrical conductors 107a-b. It should be noted that by voltage loss or drop (during the passage of a current in said power conductors) is meant all of the losses due to the power conductors or to their electrical connections with the different elements. Thus, an equivalent, called "parasitic" resistance, $R_1$ and $R_2$ is defined for each of said power conductors, respectively 107a and 107b.

Thus, the electronic entity 113 is configured to apply a gain G to a measurement voltage $V_m$, the voltage $V_m$ being the voltage at the terminals of the power conductor 107b, said gain G being a function of the resistances $R_1$ and $R_2$ of said power conductors 107a and 107b (said measurement voltage $V_m$ being measured via the measuring conductor 109 which is associated to the power conductor, for example at the terminations of the electrical connection 105).

More particularly, the gain G is computed or adjusted experimentally. For example, when the apparatus 101 and the conductors 107a, 107b and 109 of the connection 105 are short-circuited, i.e. the ends of said conductors 107a-b, 109, intended to be connected to a battery, are connected directly to each other, the gain should have a value such that the measured resultant voltage $V_{mes}$, at the output of the circuit 113, is substantially zero. This equality should be met when there is a passage of a nominal current adapted to the power conductors, for example in the range of a few tens of amperes for an automotive application, that being so in order to have a non-zero voltage that could be easily measured and modified, until cancellation thereof.

The measured resultant voltage $V_{mes}$ (which corresponds to the voltage $V_B$ of the battery) is the difference of the voltage $V_P$ between the power conductors 107a-b, and the measurement voltage $V_m$ of the measuring conductor 109 (voltage between the measuring conductor and a local electrical reference A) multiplied by the gain G, i.e.:

$$V_{mes} = V_P - GV_m$$

The measurement voltage $V_m$ multiplied by the gain G should correspond to the losses associated to the resistances $R_1$ and $R_2$ of the power conductors 107a-b. The voltages V1 and V2 correspond to the losses generated by the resistances associated to said power conductors 107a and 107b. Hence, it is possible to consider that:

$$G V_m = V_1 + V_2$$

and reformulate the hereinabove equation as follows:

$$V_{mes} = V_P - V_1 - V_2$$

Thus, the adjustment of the gain G according to the above criteria therefore allows obtaining the value of the voltage $V_B$ (or $V_{mes}$) at the terminals of the battery by correcting the voltage of $V_P$ at the terminals of the power conductors 107a-b of the voltage drops generated by the electrical connection 105.

Thus, the electronic entity 113 includes at least one electronic component 113a which transforms an input voltage, herein the measurement voltage $V_m$, into an output voltage $V_{m2}$, by applying a gain G thereto.

The gain applied to the measurement voltage $V_m$ may be analog $G_a$ and/or digital $G_n$.

Figure 2:
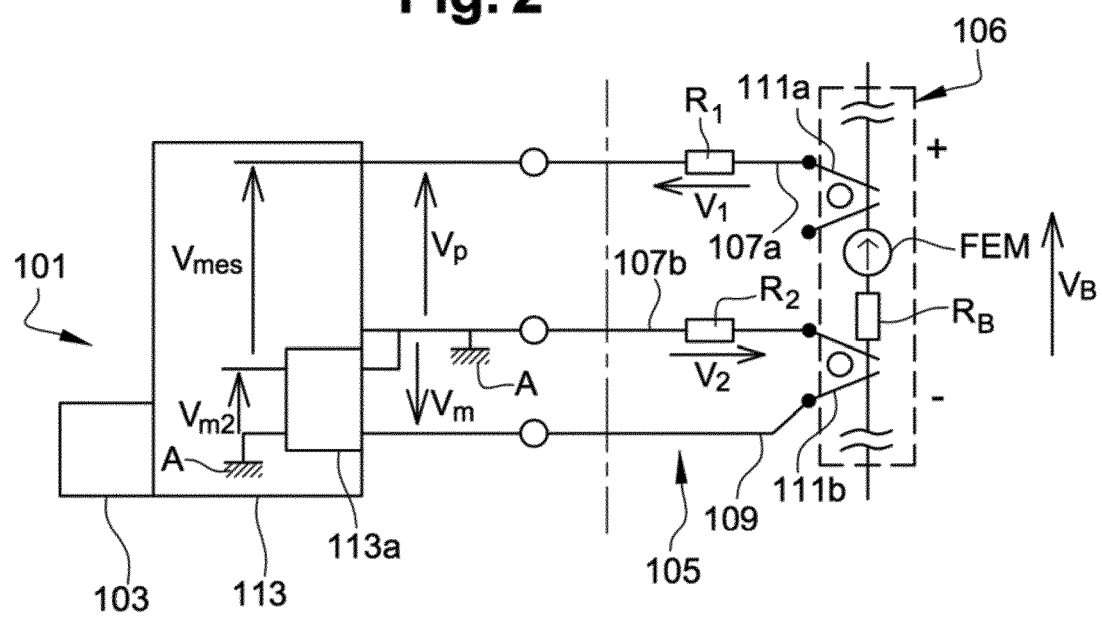
FIG. 2 is a very schematic representation of an apparatus for diagnosing, charging and/or discharging electric batteries according to the invention.
Figure 3:
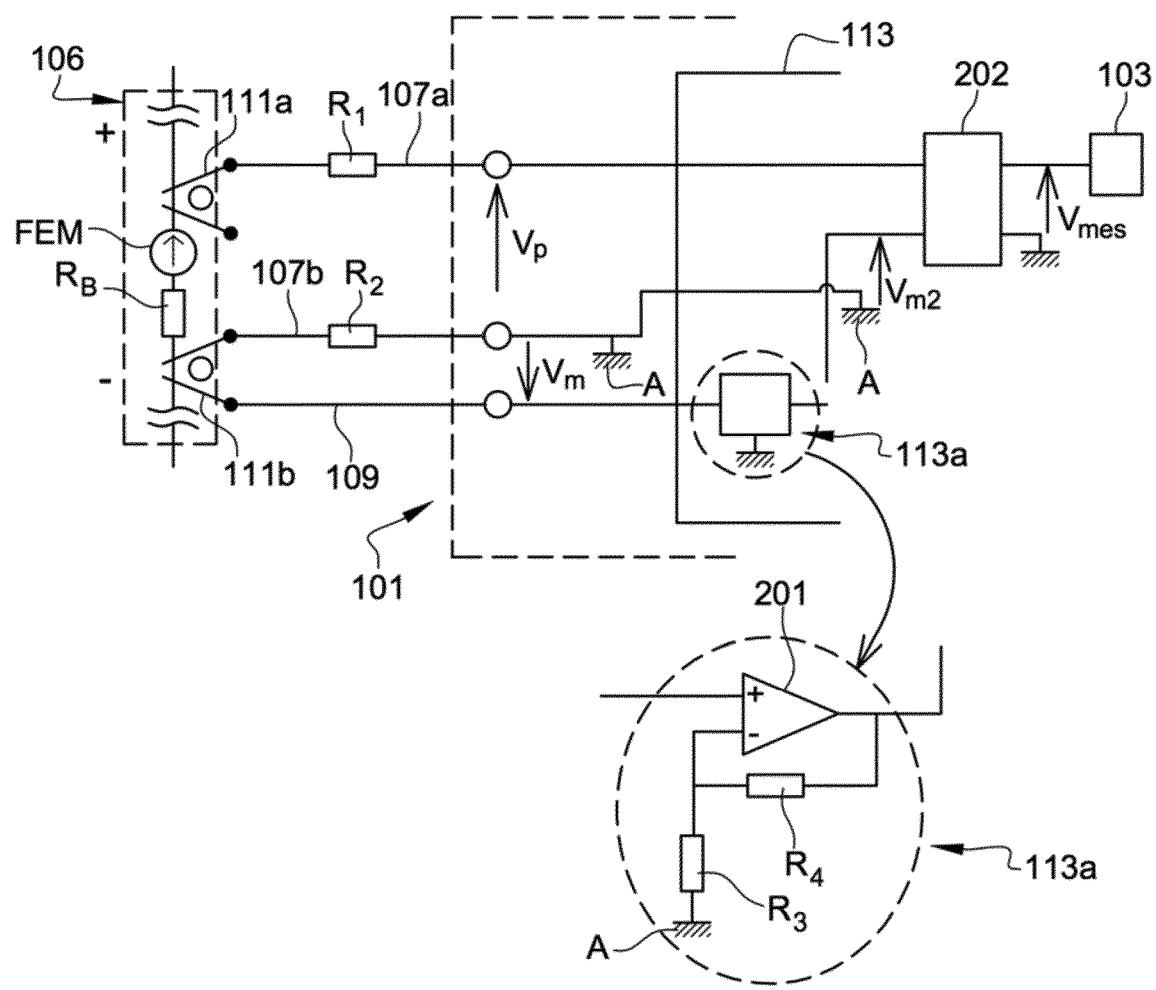
FIG. 3 is a schematic representation of a first variant embodiment of an apparatus according to the invention.

FIG. 3 is a very schematic representation of the apparatus according to a first variant of the invention. In this latter, the electronic entity 113 applies an analog gain $G_a$ to the measurement voltage $V_m$, in order to obtain a voltage $V_{m2} = G_a V_m$ at the output. Identical elements are designated by the same references as in the representation of the apparatus of FIG. 2.

More particularly, the entity 113 includes an operational amplifier 201 mounted as a non-inverting amplifier associated to two resistors $R_3$ and $R_4$, such as a foot resistor $R_3$ and a feedback resistor $R_4$.

Hence, the value of the analog gain $G_a$ is a function of the values of the resistances associated to said power conductors 107a-b and of the resistances associated to the operational amplifier 201, respectively referenced $R_1$, $R_2$, $R_3$ and $R_4$.

The resistances $R_3$ and $R_4$ associated to the operational amplifier 201 may be adjustable resistances, such as potentiometers, their values could be adjusted according to the above-described method. However, it is also possible to measure the value of the parasitic resistances $R_1$ and $R_2$ and to properly select the value of the foot $R_3$ and feedback $R_4$ resistances.

Indeed, these resistances should meet the equality below to allow obtaining, at the output of the entity 113, the value of the voltage $V_B$ at the terminals of the battery 106:

$$\frac{R_1}{R_2} = \frac{R_4}{R_3}$$

Afterwards, the voltage $V_{m2}$ at the output of the component 113a is sent towards another electronic component 202 allowing subtracting this voltage from the voltage $V_P$ at the terminals of the power conductors 107a-b and obtaining the voltage $V_{mes}$ (or $V_B$).

Figure 4:
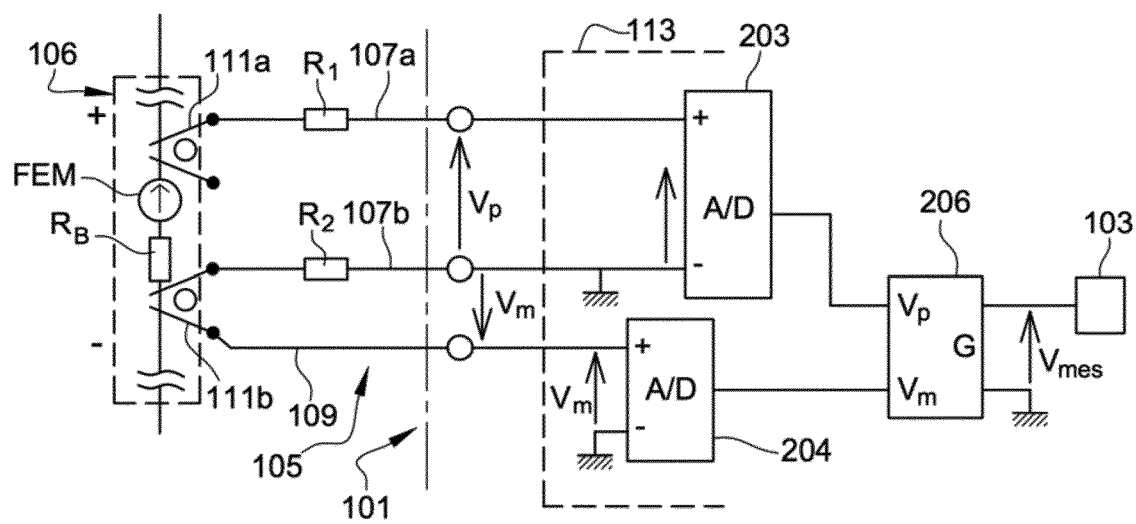
FIG. 4 is a schematic representation of a second alternative embodiment of an apparatus according to the invention.

FIG. 4 is a very schematic representation of the apparatus according to a second embodiment of the invention. Identical elements are designated by the same references as in the representation of the apparatus in FIG. 2. However, unlike the apparatus of FIG. 2, the power voltage $V_P$ and the measurement voltage $V_m$ are digitised via one or several appropriate electronic component(s), such as an analog-to-digital converter, respectively 203 and 204.

These digitised voltage quantities are sent towards another electronic component 206, such as a computer, which applies a digital gain $G_n$ to the measurement voltage V and computes the voltage at the terminals of the battery $V_{mes}$ as a function of voltages measured via the electrical connection 105. For example, these operations are carried out by software by means of a microprocessor of said apparatus 101.

Like before, the electronic entity 113, via the converters 203, 204 and the computer 206, applies a digital gain $G_n$ to the measurement voltage $V_{mes}$ and provides at the output a battery voltage $V_{mes}$ or $V_B$. In addition, the digital gain $G_n$ is also adjusted as a function of the parasitic resistances $R_1$, $R_2$ associated to the conductors 107a-b (for example according to the method described before).

Irrespective of the variant, when the gain G is properly adjusted, the resulting measured voltage $V_{mes}$ is identified with the actual voltage at the terminals of the battery and allows deducing electrical quantities of said battery therefrom, such as the internal resistance (or conductance) value of said battery.

In the above-described variants, the voltage compensation electronic entity 113 is disposed in the apparatus 101, or in a dedicated external case connected to said conductors.

In another variant that is not represented, the apparatus 101 is configured to identify the electrical connection 105 connected to said apparatus and request an adjustment or calibration of the gain if the conductors have been modified.

Thus, said electrical connection 105, or each of said conductors 107a, 107b, 109 may comprise one or several identification means, such as an EPROM, a RFID chip, a barcode, etc. in order to determine the gain G to be applied or the value of the parasitic resistances (and to adjust the gain G accordingly). To this end, the apparatus 101 may comprise a means for detecting or reading said identification means, such as a barcode reader, a RFID reader, etc. to read said identification means of said electrical connection 105.

In another embodiment that is not represented, said feedback resistor $R_4$ is accommodated in the electrical connection 105 and configured to connect to the operational amplifier 201 of the electronic component 113a applying the gain $G_a$ (said resistor having an appropriate value according to the parasitic resistances of said power conductors).

The invention claimed is:

1. An apparatus for diagnosing, charging and/or discharging electric batteries, said apparatus comprising:
    a circuit for diagnosing, charging and/or discharging batteries;
    an electrical connection to connect said apparatus to positive and negative terminals of a battery;
    wherein the electrical connection includes only three electrical conductors, the only three electrical conductors comprising:
        two power electrical conductors to be connected respectively to the positive and negative terminals of the battery; and
        only one measuring electrical conductor to be connected to one of the terminals of said battery;
    wherein said apparatus comprises a voltage drop compensation electronic entity allowing compensating for the voltage drop caused by the power electrical conductors.

2. The apparatus according to claim 1, wherein the voltage drop compensation electronic entity applies a gain to a measurement voltage, the measurement voltage being a voltage at a terminal of one of the power electrical conductors.

3. The apparatus according to claim 2, wherein the voltage drop compensation electronic entity includes at least one electronic component to apply an analog gain and/or a digital gain to the measurement voltage.

4. The apparatus according to claim 3, wherein said digital gain is generated by software by means of a microprocessor of said apparatus.

5. The apparatus according to claim 2, wherein the gain is a function of resistances associated with said power electrical conductors.

6. The apparatus according to claim 3, wherein said at least one electronic component includes an operational amplifier mounted as a non-inverting amplifier and at least two resistors.

7. The apparatus according to claim 6, wherein the at least two resistors associated with the operational amplifier have adjustable values of resistance.

8. The apparatus according to claim 6, wherein the analog gain is a function of resistances associated with said power electrical conductors and of values of resistance of the at least two resistors associated with the operational amplifier.

9. The apparatus according to claim 1, wherein the only one measuring electrical conductor is to connect to the negative terminal of the battery.

10. The apparatus according to claim 1, wherein the voltage drop compensation electronic entity is disposed in the apparatus.

11. The apparatus according to claim 2, wherein the gain is adjusted so that when short-circuiting said electrical connection, a measured voltage at an output of the voltage drop compensation electronic entity circuit is substantially equal to zero.

* * * * *